US012740007B2

(12) United States Patent
Yang et al.

(10) Patent No.: US 12,740,007 B2
(45) Date of Patent: Sep. 15, 2026

(54) LIQUID-COOLING COOLER FOR POWER MODULE OF ELECTRIC VEHICLE

(71) Applicant: AMULAIRE THERMAL TECHNOLOGY, INC., New Taipei City (TW)

(72) Inventors: Ching-Ming Yang, New Taipei City (TW); Kuo-Wei Lee, New Taipei City (TW); Tze-Yang Yeh, New Taipei City (TW); Chien-Cheng Wu, New Taipei City (TW); Chun-Lung Wu, New Taipei City (TW); Yi-Hsin Huang, New Taipei City (TW); Ming-Hsuan Chang, Taoyuan City (TW)

(73) Assignee: AMULAIRE THERMAL TECHNOLOGY, INC., New Taipei City (TW)

( * ) Notice: Subject to any disclaimer, the term of this patent is extended or adjusted under 35 U.S.C. 154(b) by 286 days.

(21) Appl. No.: 18/769,340

(22) Filed: Jul. 10, 2024

(65) Prior Publication Data

US 2026/0020185 A1 Jan. 15, 2026

(51) Int. Cl.
*H05K 7/20* (2006.01)

(52) U.S. Cl.
CPC ..... *H05K 7/20263* (2013.01); *H05K 7/20254* (2013.01); *H05K 7/20927* (2013.01)

(58) Field of Classification Search
CPC .. F28F 3/048; F28F 13/00; F28F 13/14; F28F 21/084–085; F28F 2215/00; F28F 2215/04; H05K 7/20; H05K 7/20009; H05K 7/20236; H05K 7/20254; H05K 7/20263; H05K 7/20272; H05K 7/203; H05K 7/2039; H05K 7/20409; H05K 7/208; H05K 7/20845; H05K 7/20854; H05K 7/20872; H05K 7/209; H05K 7/20927; F28D 2021/0028; G06F 1/20
See application file for complete search history.

(56) References Cited

U.S. PATENT DOCUMENTS

| | | | | |
|---|---|---|---|---|
| 2019/0363036 A1* | 11/2019 | Arai | H05K 7/20254 | |
| 2020/0214172 A1* | 7/2020 | Chen | H05K 7/20272 | |
| 2020/0344920 A1* | 10/2020 | Lee | H05K 7/20927 | |
| 2021/0335693 A1* | 10/2021 | Yamada | H05K 7/20263 | |
| 2023/0200022 A1* | 6/2023 | Peng | H05K 7/203 | 361/679.53 |
| 2024/0116356 A1* | 4/2024 | Lee | B60K 1/00 | |

(Continued)

*Primary Examiner* — Amir A Jalali
(74) *Attorney, Agent, or Firm* — Li & Cai Intellectual Property Office

(57) ABSTRACT

A liquid-cooling cooler for an electric vehicle power module includes a liquid-cooling plate and a plurality of fin regions. A first rectangular region formed by outward extension of four sides of a projection of a heat source is defined as a heat source fin region among the plurality of fin regions. A second rectangular region extending outward from the heat source fin region in a counter flow direction of the coolant is defined as an upstream fin region. A third rectangular region extending outward from the heat source fin region in a flow direction of the coolant is defined as a downstream fin region. A fin density of the heat source fin region is greater than that of the downstream fin region, and the fin density of the downstream fin region is greater than or equal to that of the upstream fin region.

18 Claims, 7 Drawing Sheets

(56) References Cited

U.S. PATENT DOCUMENTS

2024/0121913 A1* 4/2024 Hsiung ................ H05K 7/2039
2024/0224464 A1* 7/2024 Huang ............... H05K 7/20254
2024/0324150 A1* 9/2024 Choi ...................... H05K 7/209

* cited by examiner

LIQUID-COOLING COOLER FOR POWER MODULE OF ELECTRIC VEHICLE

FIELD OF THE DISCLOSURE

The present disclosure relates to a liquid-cooling cooler, and more particularly to a liquid-cooling cooler for an electric vehicle power module.

BACKGROUND OF THE DISCLOSURE

Currently, commercially available electric vehicle (EV) power modules such as an insulated gate bipolar transistor (IGBT) module or an advanced driver assistance system (ADAS) module has an increasing number of chips and regions that require heat-dissipation, so much so that existing liquid-cooling coolers are unable to meet the heat-dissipation requirements of the EV power modules. Therefore, how heat can be more effectively dissipated via liquid-cooling technology has become an issue to be addressed in the relevant industry.

SUMMARY OF THE DISCLOSURE

In response to the above-referenced technical inadequacies, the present disclosure provides a liquid-cooling cooler for an electric vehicle power module.

In order to solve the above-mentioned problems, one of the technical aspects adopted by the present disclosure is to provide a liquid-cooling cooler for an electric vehicle power module, and the liquid-cooling cooler includes a liquid-cooling plate and a plurality of fin regions. The liquid-cooling plate has a first heat dissipation surface and a second heat dissipation surface that are opposite to each other. The first heat dissipation surface is configured to be in contact with a coolant, and the second heat dissipation surface is configured to be in contact with a plurality of heat sources of the electric vehicle power module. The fin regions are located on the first heat dissipation surface. A first rectangular region formed by outward extension of four sides of a projection of a heat source is defined as a heat source fin region among the plurality of fin regions. A second rectangular region that is of same size as the heat source fin region and that extends outward from the heat source fin region in a counter flow direction of the coolant is defined as an upstream fin region among the plurality of fin regions. A third rectangular region that is of same size as the heat source fin region and that extends outward from the heat source fin region in a flow direction of the coolant is defined as a downstream fin region among the plurality of fin regions. A fin density of the heat source fin region is greater than that of the downstream fin region, and the fin density of the downstream fin region is greater than or equal to that of the upstream fin region. Alternatively, the fin density of the heat source fin region is greater than or equal to that of the downstream fin region, and the fin density of the downstream fin region is greater than that of the upstream fin region.

In one of the possible or preferred embodiments, the heat source is formed of a chip, and the first rectangular region formed by extending at least 1 mm outward from the four sides of the projection of the chip is defined as the heat source fin region.

In one of the possible or preferred embodiments, the heat source is formed of two or more chips, and the first rectangular region formed by extending at least 1 mm outward from the four sides of the projection of a smallest rectangle enclosing the two or more chips is defined as the heat source fin region.

In one of the possible or preferred embodiments, the fin density of each of the fin regions is defined, in each of the fin regions, as a total surface area of fins being divided by a total fin projection area.

In one of the possible or preferred embodiments, the liquid-cooling plate and a plurality of fins in the fin regions are formed by metal injection molding, forging, or stamping.

In one of the possible or preferred embodiments, the liquid-cooling plate and a plurality of fins of the fin regions are made of copper, copper alloy, aluminum, or aluminum alloy.

In one of the possible or preferred embodiments, a fin density ratio of the heat source fin region to the downstream fin region is configured to be from 1 to 1.3.

In one of the possible or preferred embodiments, a fin density ratio of the heat source fin region to the upstream fin region is configured to be from 1.2 to 1.5.

In one of the possible or preferred embodiments, a fin density ratio of the downstream fin region to the upstream fin region is configured to be from 1 to 1.5.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
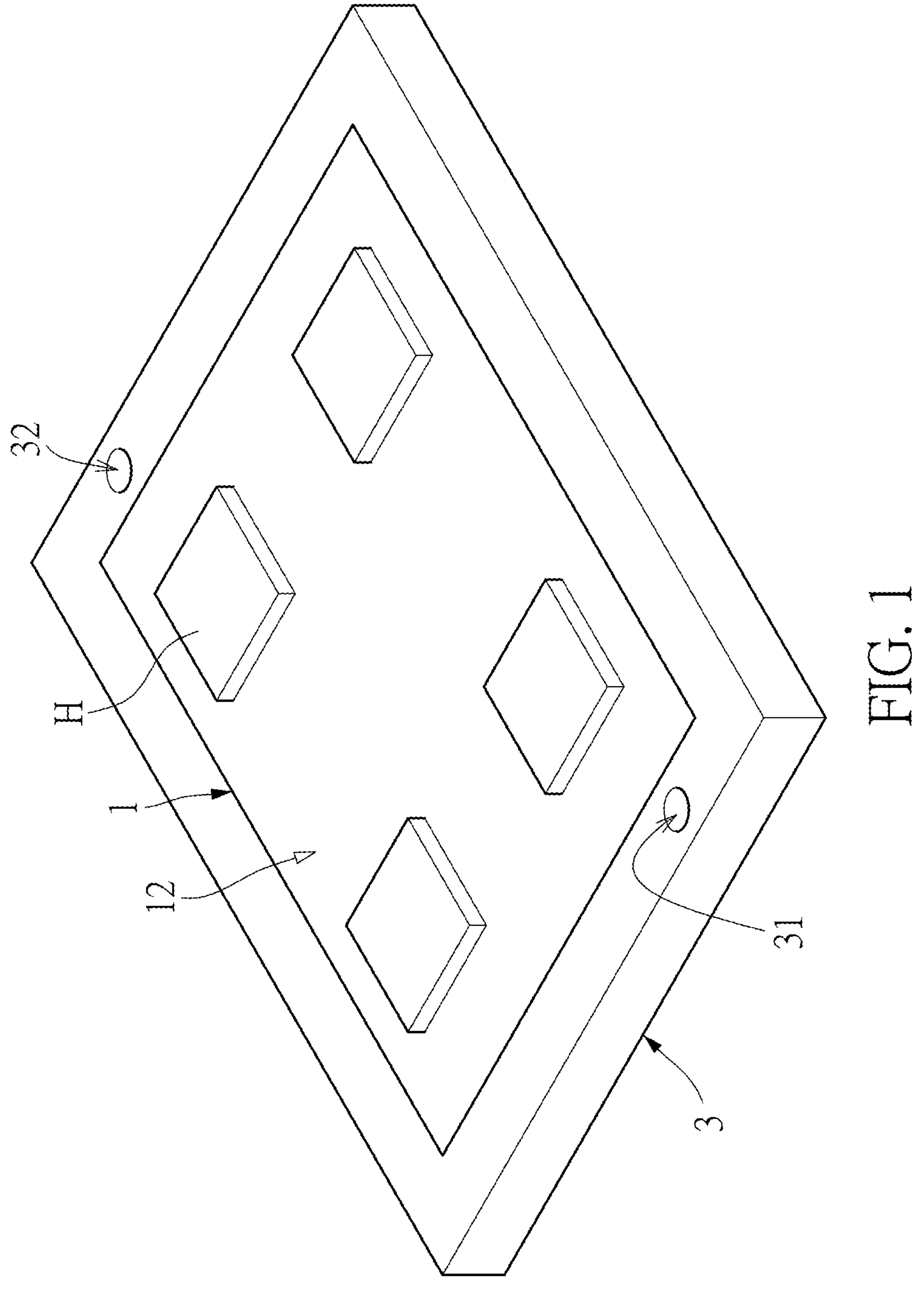
FIG. 1 is a schematic perspective view of a liquid-cooling cooler according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of “a,” “an” and “the” includes plural reference, and the meaning of “in” includes “in” and “on.” Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides a liquid-cooling cooler for an electric vehicle power module. The liquid-cooling cooler mainly includes a liquid-cooling plate 1 and a plurality of fin regions 2. The liquid-cooling plate 1 has a first heat dissipation surface 11 and a second heat dissipation surface 12 that are opposite to each other.

The first heat dissipation surface 11 is configured to be in contact with a coolant (e.g., water or ethylene glycol), and the fin regions 2 are located on the first heat dissipation surface 11. The second heat dissipation surface 12 is configured to be in contact with a plurality of heat sources H of the electric vehicle power module. Each of the heat sources H can be a chip, a direct bonded copper ceramic (DBC) substrate having a chip, or an active metal brazing (AMB) ceramic substrate having a chip, and the electric vehicle power module can be an insulated gate bipolar transistor (IGBT) module or an automotive advanced driver assistance system (ADAS) module.

Figure 2:
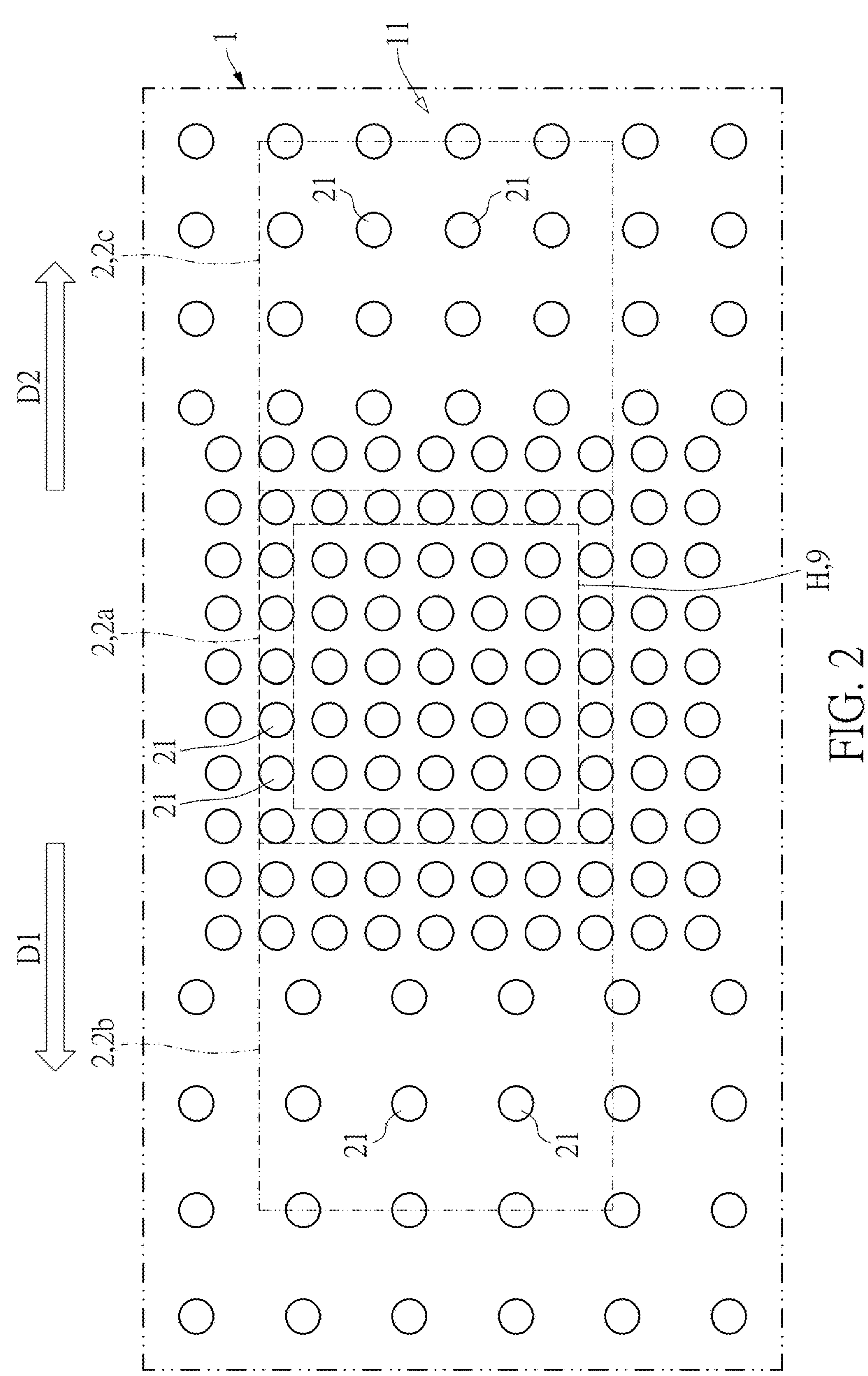
FIG. 2 is a schematic partial top view of fin regions according to the first embodiment of the present disclosure.

In this embodiment, as shown in FIG. 2, the first rectangular region formed by outward extension of the four sides of the projection of the heat source H on the first heat dissipation surface 11 is defined as the heat source fin region 2*a* among the plurality of fin regions 2. Additionally, the second rectangular region that is of same size (length and width) as the heat source fin region 2*a* and that extends outward from the heat source fin region 2*a* in the counter flow direction D1 of the coolant is defined as the upstream fin region 2*b* among the plurality of fin regions 2. Furthermore, the third rectangular region that is of same size (length and width) as the heat source fin region 2*a* and that extends outward from the heat source fin region 2*a* in the flow direction D2 of the coolant is defined as the downstream fin region 2*c* among the plurality of fin regions 2. Meanwhile, the fin density of the heat source fin region 2*a* is greater than that of the downstream fin region 2*c*, and the fin density of the downstream fin region 2*c* is greater than or equal to (≥) that of the upstream fin region 2*b*. Alternatively, the fin density of the heat source fin region 2*a* is greater than or equal to (≥) that of the downstream fin region 2*c*, and the fin density of the downstream fin region 2*c* is greater than that of the upstream fin region 2*b*. Thus, heat dissipation can be performed specifically for these heat sources H of the electric vehicle power module via these heat source fin regions 2*a* with higher fin densities. Additionally, flow rate of the coolant can be accelerated as the coolant passes through the upstream fin regions 2*b* and downstream fin regions 2*c* with lower fin densities, thereby rapidly carrying away high heat. Consequently, the overall heat dissipation temperature can be uniform.

In this embodiment, each of the heat sources H can be formed of a chip 9, and the first rectangular region formed by extending at least 1 mm outward from the four sides of the projection of the chip 9 is defined as the heat source fin region 2*a* among the plurality of fin regions 2. Furthermore, the outermost fins 21 in the heat source fin region 2*a* will be tangent to the four sides of the heat source fin region 2*a*. Additionally, the upstream fin region 2*b* does not overlap with the preceding heat source fin region 2*a*, and the downstream fin region 2*c* does not overlap with the subsequent heat source fin region 2*a*.

Figure 4:
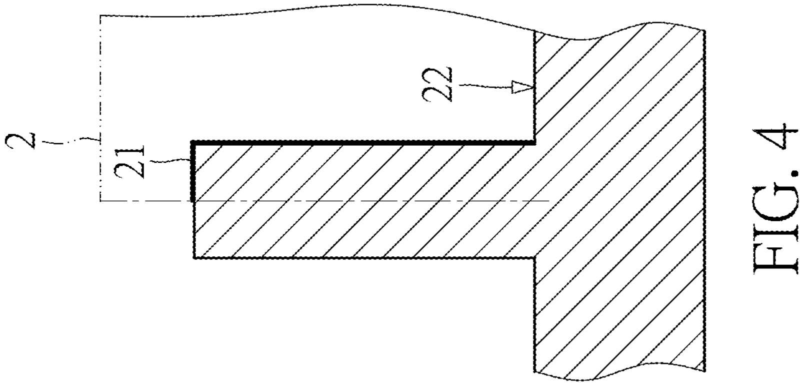
FIG. 4 is a schematic side view of another fin according to the first embodiment of the present disclosure.
Figure 3:
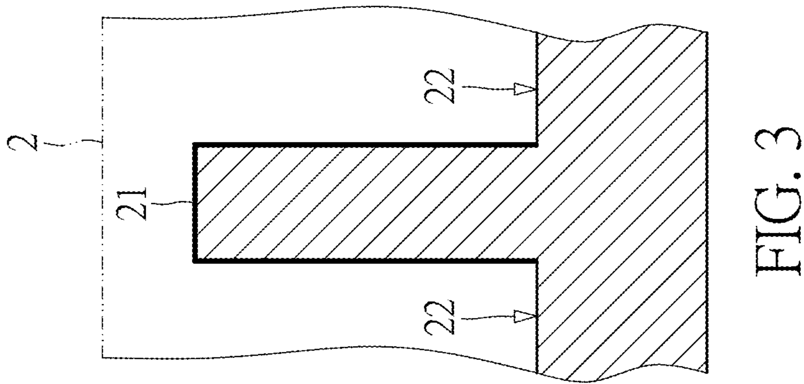
FIG. 3 is a schematic side view of a fin according to the first embodiment of the present disclosure.

Furthermore, the fin density of each of the fin regions 2 is defined, in each of the fin regions 2, as a total surface area of fins 21 being divided by a total fin projection area. Specifically, the projection area of the fins 21 is defined as the rectangular projection area of the fin region 2. The total surface area of the fins 21 is defined as the surface area of all of the fins 21 within the fin region 2, plus the area of the surface 22 within the fin region 2 that is not occupied by the fins 21 (as shown in FIG. 3). Additionally, if any one of the fins 21 is cut by the fin region 2, the surface area of that fin 21 is considered to be the surface area of said fin 21 within the fin region 2 (as shown in FIG. 4).

To ensure a more uniform heat dissipation temperature, the fin density ratio of the heat source fin region 2*a* to the downstream fin region 2*c* is configured to be from 1 to 1.3, the fin density ratio of the heat source fin region 2*a* to the upstream fin region 2*b* is configured to be from 1.2 to 1.5, and the fin density ratio of the downstream fin region 2*c* to the upstream fin region 2*b* is configured to be from 1 to 1.5.

In this embodiment, the liquid-cooling plate 1 and the fins 21 of the fin regions 2 are formed by metal injection molding, forging, or stamping. Additionally, the liquid-cooling plate 1 and the fins 21 of the fin regions 2 are made of copper, copper alloy, aluminum, or aluminum alloy.

In this embodiment, the liquid-cooling cooler also includes a base 3 bonded with the liquid-cooling plate 1, and the base 3 has an inlet 31 and an outlet 32 for the coolant to flow in and out. The base 3 can be formed by metal injection molding, forging, or stamping. Additionally, the base 3 can be made of copper, copper alloy, aluminum, or aluminum alloy.

Second Embodiment

Figure 5:
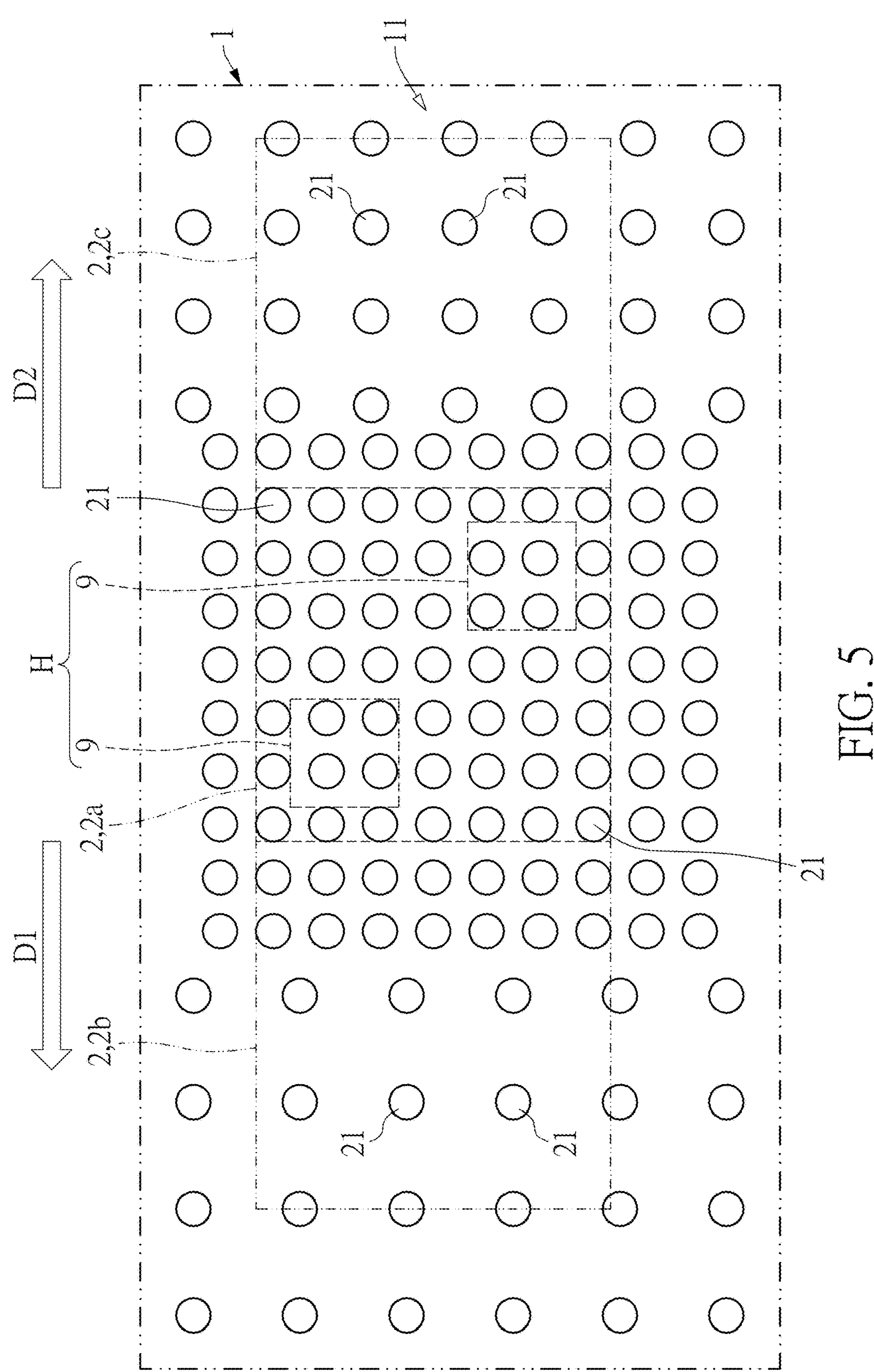
FIG. 5 is a schematic partial top view of fin regions according to a second embodiment of the present disclosure.
Figure 6:
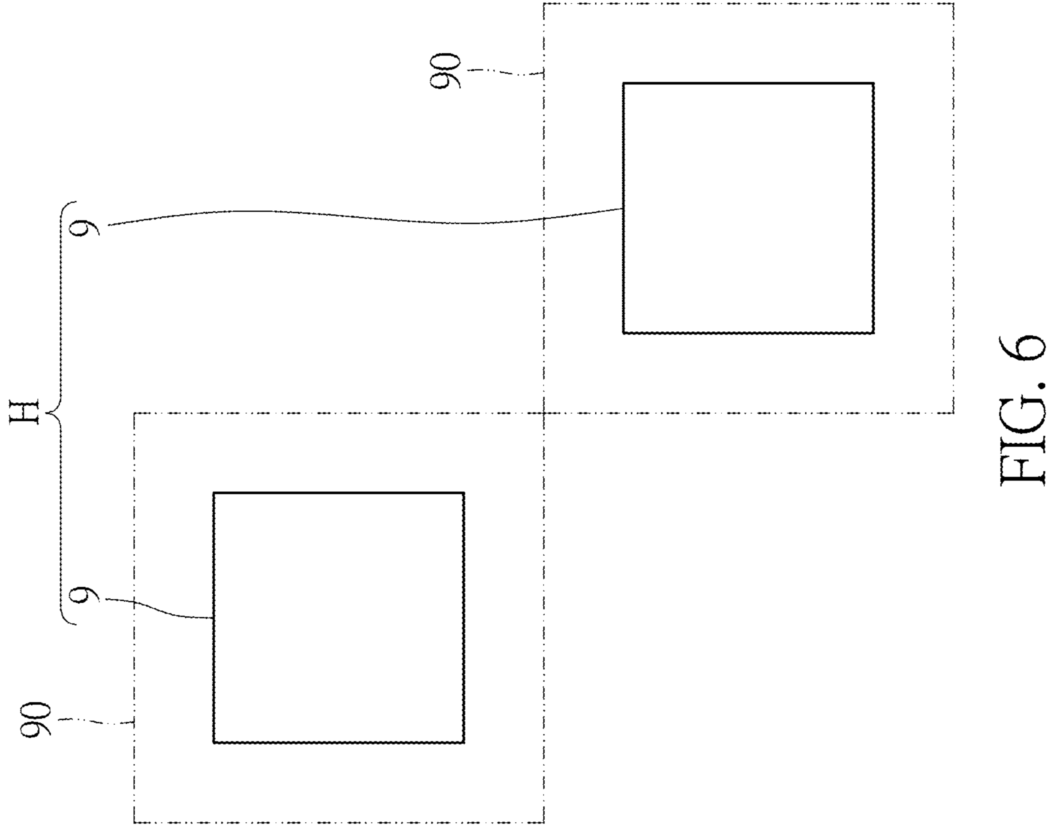
FIG. 6 is a schematic top view of a heat source according to the second embodiment of the present disclosure.

Reference is made to FIG. 5 and FIG. 6, which show a second embodiment of the present disclosure. This embodiment is substantially the same as the first embodiment, and the differences therebetween are described below.

In this embodiment, each of the heat sources H is formed of two or more chips 9, and the first rectangular region formed by extending at least 1 mm outward from the four sides of the projection of a smallest rectangle enclosing the two or more chips 9 is defined as the heat source fin region 2*a*.

Furthermore, the rectangular region 90 formed by extending 1 mm outward from the four sides of the projection of one chip 9 and the rectangular region 90 formed by extending 1 mm outward from the four sides of the projection of another chip 9, when in contact with each other, are defined as a single heat source H (as shown in FIG. 6).

Third Embodiment

Figure 7:
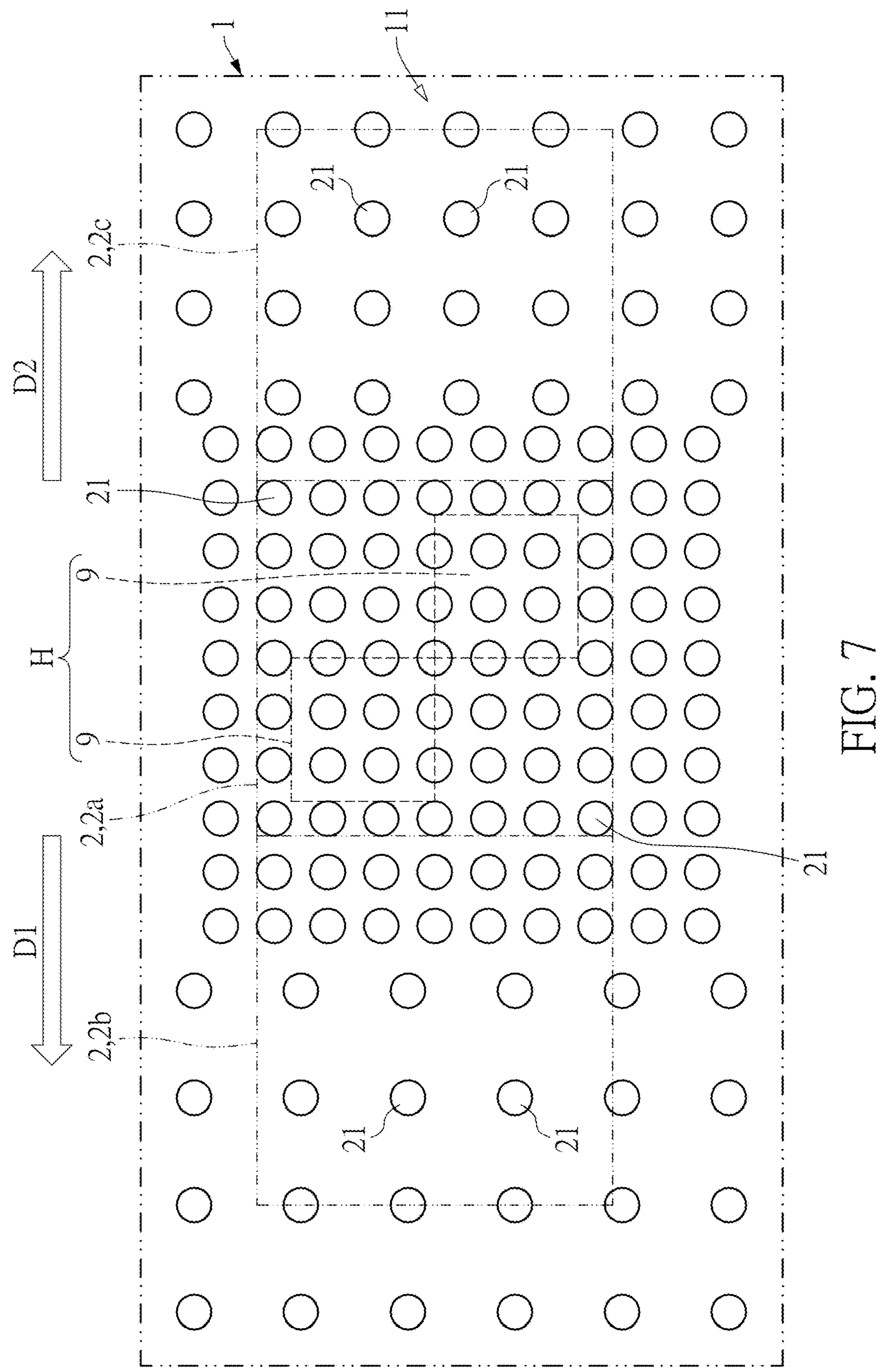
FIG. 7 is a schematic partial top view of fin regions according to a third embodiment of the present disclosure.
Figure 8:
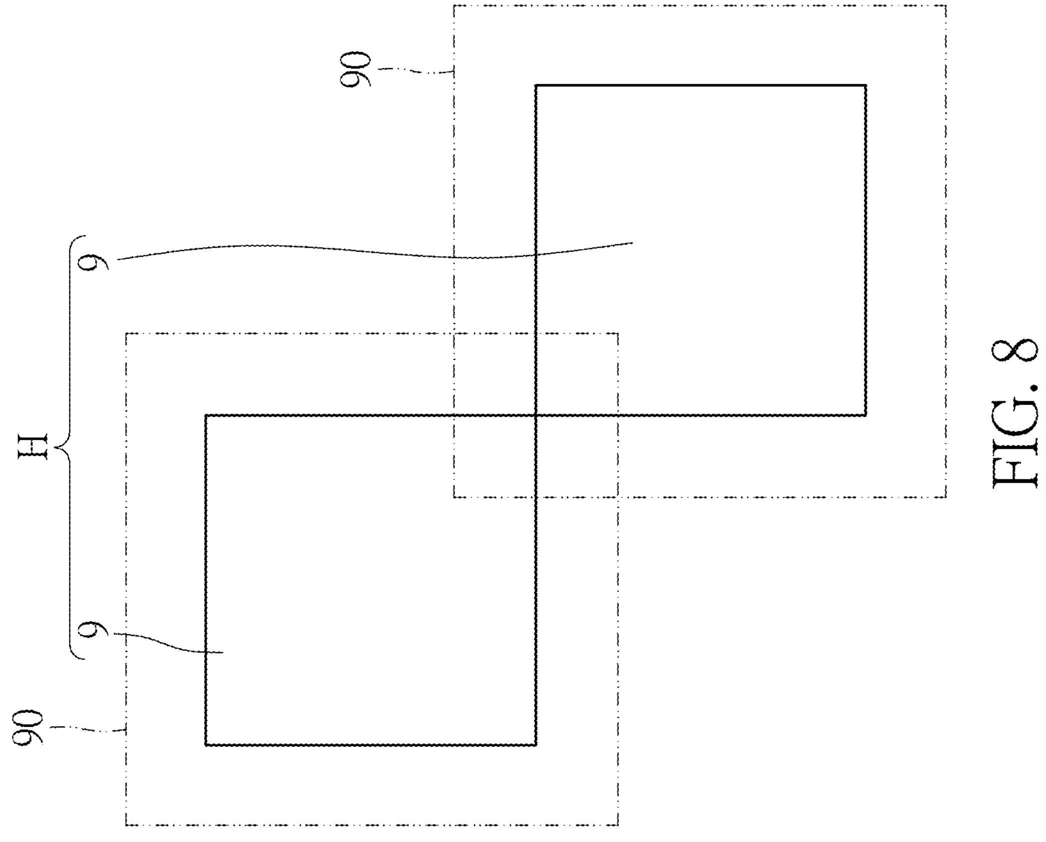
FIG. 8 is a schematic top view of a heat source according to the third embodiment of the present disclosure.

Reference is made to FIG. 7 and FIG. 8, which show a third embodiment of the present disclosure. This embodiment is substantially the same as the first and second embodiments, and the differences therebetween are described below.

In this embodiment, each of the heat sources H is formed of two or more chips 9, and the first rectangular region formed by extending at least 1 mm outward from the four sides of the projection of a smallest rectangle enclosing the two or more chips 9 is defined as the heat source fin region.

Furthermore, the rectangular region 90 formed by extending 1 mm outward from the four sides of the projection of one chip 9 and the rectangular region 90 formed by extending 1 mm outward from the four sides of the projection of another chip 9, when overlapping each other, are defined as a single heat source H (as shown in FIG. 8).

Beneficial Effects of the Embodiments

In summary, the present disclosure provides a liquid-cooling cooler for an electric vehicle power module, and the liquid-cooling cooler includes a liquid-cooling plate and a plurality of fin regions. The liquid-cooling plate has a first heat dissipation surface and a second heat dissipation surface that are opposite to each other. The first heat dissipation surface is configured to be in contact with a coolant, and the second heat dissipation surface is configured to be in contact with a plurality of heat sources of the electric vehicle power module. The fin regions are located on the first heat dissipation surface. A first rectangular region formed by outward extension of four sides of a projection of a heat source is defined as a heat source fin region among the plurality of fin regions. A second rectangular region that is of same size as the heat source fin region and that extends outward from the heat source fin region in a counter flow direction of the coolant is defined as an upstream fin region among the plurality of fin regions. A third rectangular region that is of same size as the heat source fin region and that extends outward from the heat source fin region in a flow direction of the coolant is defined as a downstream fin region among the plurality of fin regions. A fin density of the heat source fin region is greater than that of the downstream fin region, and the fin density of the downstream fin region is greater than or equal to that of the upstream fin region. Alternatively, the fin density of the heat source fin region is greater than or equal to that of the downstream fin region, and the fin density of the downstream fin region is greater than that of the upstream fin region. Thus, heat dissipation can be performed specifically for these heat sources of the electric vehicle power module via these heat source fin regions with higher fin densities. Additionally, flow rate of the coolant can be accelerated as the coolant passes through the upstream fin regions and downstream fin regions with lower fin densities, thereby rapidly carrying away high heat. Consequently, the overall heat dissipation temperature can be uniform.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A liquid-cooling cooler for an electric vehicle power module, comprising:

a liquid-cooling plate having a first heat dissipation surface and a second heat dissipation surface that are opposite to each other, wherein the first heat dissipation surface is configured to be in contact with a coolant, and the second heat dissipation surface is configured to be in contact with a plurality of heat sources of the electric vehicle power module; and a plurality of fin regions being located on the first heat dissipation surface;

wherein a first rectangular region formed by outward extension of four sides of a projection of the heat source is defined as a heat source fin region among the plurality of fin regions;

wherein a second rectangular region being of same size as the heat source fin region and extending outward from the heat source fin region in a counter flow direction of the coolant, is defined as an upstream fin region among the plurality of fin regions;

wherein a third rectangular region being of same size as the heat source fin region and extending outward from the heat source fin region in a flow direction of the coolant, is defined as a downstream fin region among the plurality of fin regions;

wherein a fin density of the heat source fin region is greater than a fin density of the downstream fin region, and the fin density of the downstream fin region is greater than or equal to a fin density of the upstream fin region.

2. The liquid-cooling cooler according to claim 1, wherein each of the plurality of heat sources is formed of a chip, and the first rectangular region formed by extending at least 1 mm outward from the four sides of the projection of the chip is defined as the heat source fin region.

3. The liquid-cooling cooler according to claim 1, wherein each of the plurality of heat sources is formed of two or more chips, and the first rectangular region formed by extending at least 1 mm outward from the four sides of the projection of a smallest rectangle enclosing the two or more chips is defined as the heat source fin region.

4. The liquid-cooling cooler according to claim 1, wherein the fin density of each of the fin regions is defined, in each of the fin regions, as a total surface area of fins being divided by a total fin projection area.

5. The liquid-cooling cooler according to claim 1, wherein the liquid-cooling plate and a plurality of fins of the fin regions are formed by metal injection molding, forging, or stamping.

6. The liquid-cooling cooler according to claim 1, wherein the liquid-cooling plate and a plurality of fins of the fin regions are made of copper, copper alloy, aluminum, or aluminum alloy.

7. The liquid-cooling cooler according to claim 1, wherein a fin density ratio of the heat source fin region to the downstream fin region is configured to be from 1 to 1.3.

8. The liquid-cooling cooler according to claim 1, wherein a fin density ratio of the heat source fin region to the upstream fin region is configured to be from 1.2 to 1.5.

9. The liquid-cooling cooler according to claim 1, wherein a fin density ratio of the downstream fin region to the upstream fin region is configured to be from 1 to 1.5.

10. A liquid-cooling cooler for an electric vehicle power module, comprising:

a liquid-cooling plate having a first heat dissipation surface and a second heat dissipation surface that are opposite to each other, wherein the first heat dissipation surface is configured to be in contact with a coolant, and the second heat dissipation surface is configured to be in contact with a plurality of heat sources of the electric vehicle power module; and a plurality of fin regions being located on the first heat dissipation surface;

wherein a first rectangular region formed by outward extension of four sides of a projection of the heat source is defined as a heat source fin region among the plurality of fin regions;

wherein a second rectangular region being of same size as the heat source fin region and extending outward from the heat source fin region in a counter flow direction of the coolant, is defined as an upstream fin region among the plurality of fin regions;

wherein a third rectangular region being of same size as the heat source fin region and extending outward from the heat source fin region in a flow direction of the coolant, is defined as a downstream fin region among the plurality of fin regions;

wherein a fin density of the heat source fin region is greater than or equal to a fin density of the downstream fin region, and the fin density of the downstream fin region is greater than a fin density of the upstream fin region.

11. The liquid-cooling cooler according to claim 10, wherein each of the plurality of heat sources is formed of a chip, and the first rectangular region formed by extending at least 1 mm outward from the four sides of the projection of the chip is defined as the heat source fin region.

12. The liquid-cooling cooler according to claim 10, wherein each of the plurality of heat sources is formed of two or more chips, and the first rectangular region formed by extending at least 1 mm outward from the four sides of the projection of a smallest rectangle enclosing the two or more chips is defined as the heat source fin region.

13. The liquid-cooling cooler according to claim 10, wherein the fin density of each of the fin regions is defined, in each of the fin regions, as a total surface area of fins being divided by a total fin projection area.

14. The liquid-cooling cooler according to claim 10, wherein the liquid-cooling plate and a plurality of fins of the fin regions are formed by metal injection molding, forging, or stamping.

15. The liquid-cooling cooler according to claim 10, wherein the liquid-cooling plate and a plurality of fins of the fin regions are made of copper, copper alloy, aluminum, or aluminum alloy.

16. The liquid-cooling cooler according to claim 10, wherein a fin density ratio of the heat source fin region to the downstream fin region is configured to be from 1 to 1.3.

17. The liquid-cooling cooler according to claim 10, wherein a fin density ratio of the heat source fin region to the upstream fin region is configured to be from 1.2 to 1.5.

18. The liquid-cooling cooler according to claim 10, wherein a fin density ratio of the downstream fin region to the upstream fin region is configured to be from 1 to 1.5.

* * * * *